(12) United States Patent
Shih et al.

(10) Patent No.: US 8,742,431 B2
(45) Date of Patent: Jun. 3, 2014

(54) PHOTO-COUPLER DEVICE

(71) Applicant: Capella Microsystems (Taiwan), Inc., New Taipei (TW)

(72) Inventors: Cheng-Chung Shih, New Taipei (TW); Yuh-Min Lin, San Ramon, CA (US); Koon-Wing Tsang, Fremont, CA (US)

(73) Assignee: Capella Microsystems (Taiwan), Inc., New Taipei (TW)

( * ) Notice: Subject to any disclaimer, the term of this patent is extended or adjusted under 35 U.S.C. 154(b) by 0 days.

(21) Appl. No.: 13/734,318

(22) Filed: Jan. 4, 2013

(65) Prior Publication Data

US 2014/0001492 A1 Jan. 2, 2014

Related U.S. Application Data

(60) Provisional application No. 61/667,414, filed on Jul. 2, 2012.

(51) Int. Cl.
*H01L 27/15* (2006.01)
(52) U.S. Cl.
USPC ............................................................ 257/80
(58) Field of Classification Search
CPC ...... H01L 31/167; H01L 25/167; H01L 31/16
See application file for complete search history.

(56) References Cited

U.S. PATENT DOCUMENTS

| | | | | |
|---|---|---|---|---|
| 4,996,478 A | * | 2/1991 | Pope | 324/755.02 |
| 4,996,578 A | * | 2/1991 | Motojima et al. | 257/432 |
| 6,887,735 B2 | * | 5/2005 | Tsang | 438/57 |
| 7,511,750 B2 | * | 3/2009 | Murakami | 348/294 |
| 8,450,728 B2 | * | 5/2013 | Yamaguchi | 257/40 |
| 2013/0168552 A1 | * | 7/2013 | Tsang et al. | 250/340 |

* cited by examiner

*Primary Examiner* — Matthew Reames
*Assistant Examiner* — Nicholas J Choi
(74) *Attorney, Agent, or Firm* — Wang Law Firm, Inc.; Li K. Wang; Stephen Hsu

(57) ABSTRACT

A photo-coupler device includes a P-type substrate, a P-type epitaxial layer, an insulation layer, a plurality of shielding layers, a metal layer and a passivation layer. The P-type epitaxial layer is deposited on the P-type substrate and includes two conducting regions and a plurality of N+ electrode regions between the two conducting regions. The insulation layer is deposited on the P-type epitaxial layer. The shielding layers comprising first shielding layers and second shielding layers are deposited in the insulation layer in parallel in a horizontal direction, and the first shielding layers are arranged for correspondingly covering the two conducting regions, the second shielding layers are arranged for correspondingly covering the at least one of the N+ electrode regions. The metal layer is made of Ag and is deposited on the insulation layer. The passivation layer is deposited on the metal layer.

15 Claims, 5 Drawing Sheets

PHOTO-COUPLER DEVICE

CROSS-REFERENCE TO RELATED APPLICATION

This application is a non-provisional of U.S. Provisional Application No. 61/667,414, filed on Jul. 2, 2012, the disclosure of which is incorporated herein in its entirety by reference.

BACKGROUND OF THE INVENTION

1. Field of the Invention

The present invention generally relates to a photo-coupler device, in particular to a photo-coupler device with improved light transmittance and common-mode transient immunity.

2. Description of the Related Art

Photo-coupler is also known as an optical isolator, and abbreviated as PC. The photo-coupler transmits electrical signals by using light as a medium. The photo-coupler has a prefect isolation effect for the input signal and the output signal, and may obtain a wide range of applications in a variety of circuits.

Currently, the photo-coupler has become one of the most popular and the most versatile photoelectric devices. The photo-coupler generally consists of three portions: a light emitting portion, a light receiving portion and signal amplification portion. The light emitting portion may be a LED, which is driven by an input electrical signal to emit a certain wavelength of the light, which is received by a photo detector so as to generate a photocurrent signal, and then the signal is taken as the output after amplification. Thereby an electricity-light-electricity conversion is completed, thus the photo-coupler achieves the function of input, output and isolation.

In addition, since the input and the output of the photo-coupler are isolated from each other, the transmission of the electrical signals has unidirectional characteristics and thus the photo-coupler have a good electrical insulation capability and a noise resisting capability. Further, the input end of the photo-coupler is a current-type low resistance component and having a strong common mode suppression capability. Therefore, in the long-range transmission of signals, the photo-coupler may be employed as an terminal isolation component which may significantly improve the signal-to-noise ratio. Through the use of the photo-coupler, the electrical signals of the source may be prevented from the surge and the unstable condition caused by direct connection of the circuit of a receiving end and the source.

However, in the structure of conventional photo-coupler structure, an indium tin oxide (ITO) layer is disposed on an insulation layer. Since the optical transmittance and the electrical conductive capability of the indium tin oxide layer is unstable, the electrical conductivity of the photo-coupler structure is easily decreased and the reception signal would be inaccurate caused by the interference of the transient noise. Further, the electrical resistance of the conventional indium tin oxide layer is large and during a fast signal transmission of the conventional indium tin oxide layer, the voltage conversion efficiency and the common-mode transient resistance become poor, which leads to the distortion problem of the output signal.

SUMMARY OF THE INVENTION

In view of the drawbacks of the prior art, it is a primary objective of the present invention to provide a photo-coupler device to overcome the issues of the prior art.

The present invention provides a photo-coupler device comprising a P-type substrate, a P-type epitaxial layer, an insulating layer, a plurality of shielding layers, a metal layer and a passivation layer. The P-type epitaxial layer is deposited on the P-type substrate and includes two conducting regions and a plurality of N+ electrode regions between the two conducting regions. The insulating layer is deposited on the P-type epitaxial layer. The plurality of shielding layers comprising first shielding layers and second shielding layers are deposited in the insulation layer in parallel in a horizontal direction, and the first shielding layers are correspondingly arranged for covering the two conducting regions, the second shielding layers are correspondingly arranged for covering at least one of the N+ electrode regions. The metal layer is made of Ag and is deposited on the insulation layer. The passivation layer is deposited on the metal layer. Wherein, the covered ones of the N+ electrode regions are connected to a low-signal transmission contact, the N+ electrode regions which are not covered by the second shielding layers are connected to a high-signal transmission contact, and the metal layer, the two conducting regions and the first shielding layers covering the two conducting regions are connected to a low potential.

Preferably, the plurality of N+ electrode regions disposed between two of the conducting regions comprise a first N+ electrode region, a second N+ electrode region, a third N+ electrode region and a fourth N+ electrode region arranged sequentially, wherein the second shielding layers correspondingly cover the first N+ electrode region and the third N+ electrode region, or correspondingly cover the second N+ electrode region and the fourth N+ electrode region.

Preferably, a thickness of the metal layer is ranged from 100 Å to 200 Å.

Preferably, the shielding layers are made of Al or Cu.

Preferably, a thickness of the shielding layers is ranged from 4000 Å to 8000 Å.

Preferably, the passivation layer is made of an insulation material.

Preferably, the insulation material is silicon nitride.

Preferably, the insulation layer is made of silicon dioxide.

To achieve the foregoing objective, the present invention further provides a photo-coupler device comprising a p-type substrate, a p-type epitaxial layer, an insulation layer, a plurality of shielding layers, a metal layer and a passivation layer. The p-type epitaxial layer is deposited on the p-type substrate, and comprises two conducting regions and a plurality of N+ electrode regions disposed between the two conducting regions. The N+ electrode regions are connected to a high-signal transmission contact. The insulation layer is deposited on the p-type epitaxial layer. The plurality of shielding layers is deposited in the insulation layer in parallel in a horizontal direction and correspondingly covers the two conducting regions. The metal layer is made of Ag and is deposited on the insulation layer. The passivation layer is deposited on the metal layer. Wherein, the shielding layers, the metal layer and the two conducting regions are connected to a low potential.

Preferably, a thickness of the metal layer is ranged from 100 Å to 200 Å.

Preferably, the shielding layers are made of Al or Cu.

Preferably, a thickness of the shielding layers is ranged from 4000 Å to 8000 Å.

Preferably, the passivation layer is made of an insulation material.

Preferably, the insulation material is silicon nitride.

Preferably, the insulation layer is made of silicon dioxide.

The photo-coupler device according to the present invention may have one or more of the following advantages:

(1) The photo-coupler device of the present invention may be designed with a metal layer which is made of Ag to replace the conventional indium tin oxide layer, thereby promoting the voltage conversion efficiency and the common-mode transient immunity of the photo-coupler device since Ag has a material characteristic of low resistance value and good transmittance.

(2) The present invention improves the arrangement of the shield layer structure, resulting in a differential signal transmission manner to resolve the signal interfering problem of the transient noise.

BRIEF DESCRIPTION OF THE DRAWINGS

The detailed structure, operating principle and effects of the present invention will now be described in more details hereinafter with reference to the accompanying drawings that show various embodiments of the invention as follows.

DETAILED DESCRIPTION OF THE PREFERRED EMBODIMENTS

Figure 1:
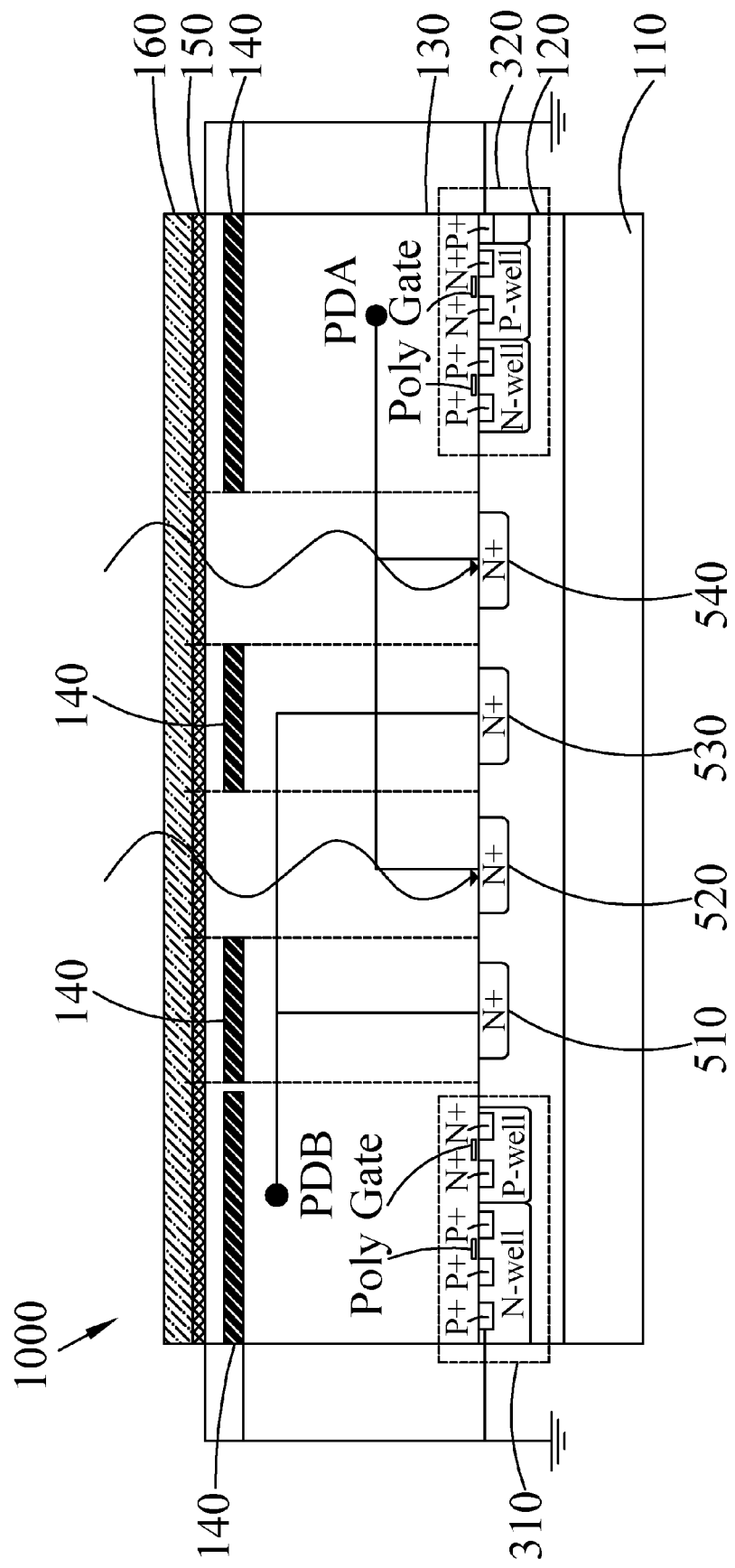
FIG. 1 is a schematic diagram of the photo-coupler device according to a first embodiment of the present invention.

The present invention is described more fully hereinafter with reference to the accompanying drawings, in which exemplary embodiments of the present invention are shown. This invention may, however, be embodied in many different forms and should not be construed as limited to the exemplary embodiments set forth herein. Rather, these exemplary embodiments are provided so that this disclosure will be thorough and complete, and will fully convey the scope of the present invention to those skilled in the art. In the drawings, the size and relative sizes of layers and regions may be exaggerated for clarity.

The following related drawings are provided for the purpose of illustrating the photo-coupler device in accordance with the present invention, and it is noteworthy that same numerals used in the following preferred embodiments represent respective same elements respectively.

With reference to FIG. 1, in which a schematic diagram of the photo-coupler device according to a first embodiment of the present invention is depicted. In FIG. 1, the photo-coupler device 1000 comprises a P-type substrate 110, a P-type epitaxial layer 120, an insulating layer 130, a plurality of shielding layers 140, a metal layer 150 and a passivation layer 160. The P-type epitaxial layer 120 is deposited on the P-type substrate 110. The insulating layer 130 is deposited on the P-type epitaxial layer 120. The shielding layers 140 are deposited in the insulation layer 130 in parallel in a horizontal direction. The metal layer 150 is deposited on the insulation layers 130. The passivation layer 160 is deposited on the metal layer 150.

The P-type epitaxial layer 120 further comprises two conducting regions 310, 320 and a plurality of N+ electrode regions between the two conducting regions 310, 320, and in which two of the shielding layers 140 are correspondingly arranged for covering the two conducting regions 310, 320, and the remaining shielding layers 140 are correspondingly arranged for covering ones of the N+ electrode regions. Wherein, the covered ones of the N+ electrode regions are connected to a low-signal transmission contact PDB, the N+ electrode regions which are not covered by the second shielding layers are connected to a high-signal transmission contact PDA, and the metal layer 150, the two conducting regions 310, 320 and the shielding layers 140 covering the two conducting regions 310, 320 are connected to a low potential contact.

Further, the plurality of N+ electrode regions disposed between two of the conducting regions 310, 320 comprise a first N+ electrode region 510, a second N+ electrode region 520, a third N+ electrode region 530 and a fourth N+ electrode region 540 arranged sequentially. The above mentioned order is only demonstrated as an example, and they can be arranged in a reverse order, alternatively. Wherein, the numbers of the N+ electrode regions are in even number, for example, 6 or 8 N+ electrode regions. And, the conducting regions 310, 320 further comprise N-wells and P-wells, respectively. The description above is only to illustrate preferred embodiments, not to limit the present invention.

It is worth noting that the at least one of the shielding layers 140 correspondingly cover the first N+ electrode region 510 and the third N+ electrode region 530, or correspondingly cover the second N+ electrode region 520 and the fourth N+ electrode region 540. Through the shielding layers 140 alternately deposited on the at least one of the N+ electrode regions, shielded ones may block a portion of light and the light may penetrate into the other ones that are not shielded. The voltage of the structure shielded by the shielding layers 140 may be used as a reference voltage. The differential signal manner of signal transmission achieved by the structure of the shielding layer is designed to prevent the signal from being influenced by the transient noise.

Wherein, the at least one of the N+ electrode regions (ex. the first N+ electrode region 510 and the third N+ electrode region 530) are connected to the low-signal transmission contact PDB so as to perform pseudo-photo coupling to transmit a low voltage potential signal. And then, the other ones of the N+ electrode regions (ex. the second N+ electrode region 520 and the fourth N+ electrode region 540) are connected to the high-signal transmission contact PDA. The other ones of the N+ electrode regions may perform true photo-coupling to transmit a high voltage potential signal, thereby transmitting the signal in the differential signal transmission manner. The description above is only to illustrate preferred embodiments, and is not to limit the present invention.

Further, the P-type substrate 110 may be made of plastic, metal or glass, and the P-type substrate 110 may be a Si-substrate, preferably. The P-type epitaxial layer 120 may be made of monocrystalline silicon or polysilicon that is formed by the epitaxy process. The insulating layer 130 may be made of silicon dioxide ($SiO_2$). The shielding layers 140 may be made of aluminum, copper or other metals. The metal layer 150 may be made of silver. The passivation layer 160 may be an insulation material, and the insulation material may be silicon nitride ($Si_3N_4$), aluminium oxide ($Al_2O_3$) or zinc oxide (ZnO). The description above is only to illustrate preferred embodiments, not to limit the present invention.

It is worth noting that the thickness of the metal layer 150 may be ranged from 100 Å to 200 Å. The thickness of the shielding layers 140 may be ranged from 4000 Å to 8000 Å. The description above is only to illustrate preferred embodiments, but the used above should not be limited.

According to the above, the shielding layers 140 have a light barrier function which blocks the light and the metal layer 150 has a light penetration function which allows the light to penetrate in the photo-coupler device 1000. The metal layer 150 is arranged for replacing the conventional used indium tin oxide layer. Therefore, when the light penetrates into the passivation layer 160 and the metal layer 150, the shielding layers 140 correspondingly covering the first N+ electrode region 510 and the third N+ electrode region 530 may block the light and prevent the light from entering into the insulation layer 130. The light may only penetrate into the unshielded ones, thereby transforming the light into a light signal so as to transmit the signal in the differential signal transmission manner. As a result, the photo-coupler device 1000 of the present invention may prevent the signal transmission from being influenced by the transient noise, so that the signal may be slowly transmitted and avoid the output distortion, thereby promoting the voltage conversion efficiency and the common-mode transient resistance of the photo-coupler device 1000.

Figure 2:
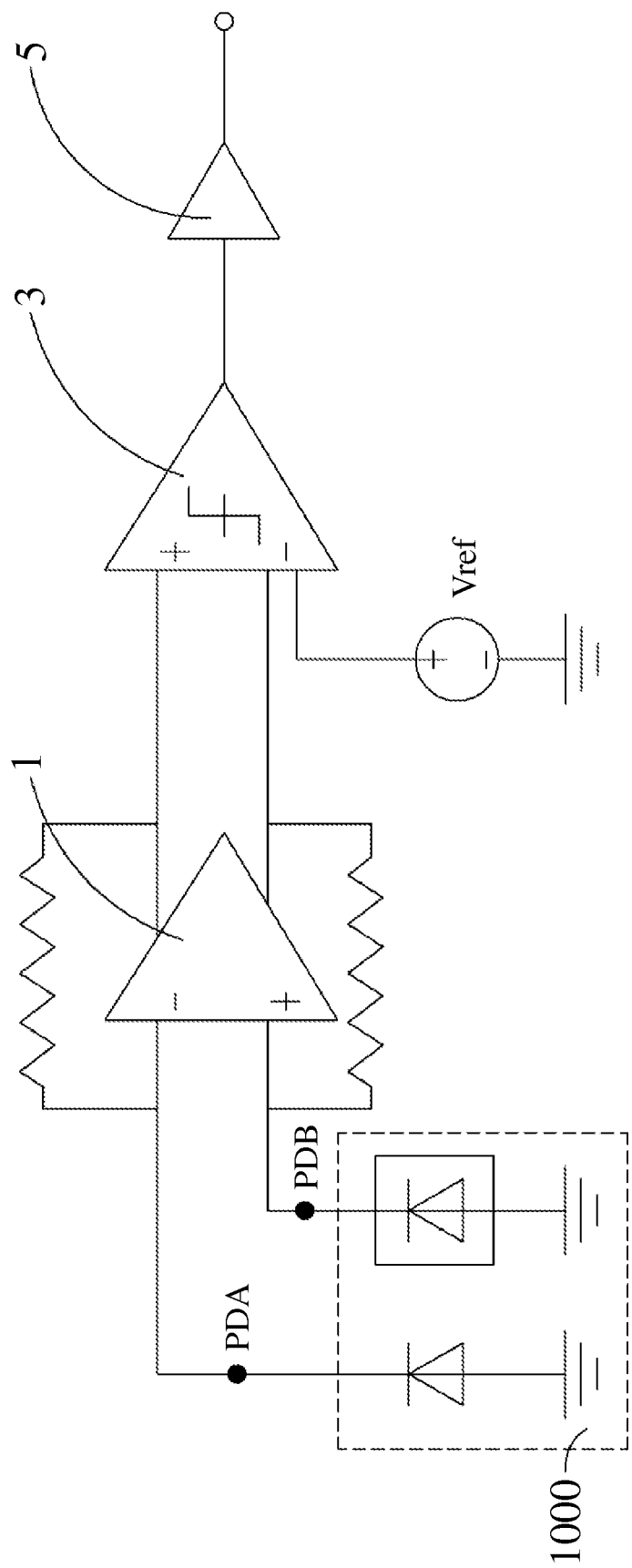
FIG. 2 is a schematic diagram of the photo-coupler device connected to a circuit according to a first embodiment of the present invention.

With reference to FIG. 2, in which a schematic diagram of the photo-coupler device connected to a circuit according to a first embodiment of the present invention as depicted. In this figure, the circuit including an amplifier 1, a comparator 3, and an output buffer 5. The photo-coupler device 1000 as depicted in FIG. 1 is connected to an input-end of the amplifier 1, and the comparator 3 receives a transmitting signal of the amplifier 1 and a reference voltage Vref. The low-signal transmission contact PDB of the photo-coupler device 1000 is connected to a positive electrode of the amplifier 1. The high-signal transmission contact PDA of the photo-coupler device 1000 is connected to a negative electrode of the amplifier 1. Wherein, the amplifier 1 may preferably be a differential amplifier, but should not be limited thereto.

Figure 3:
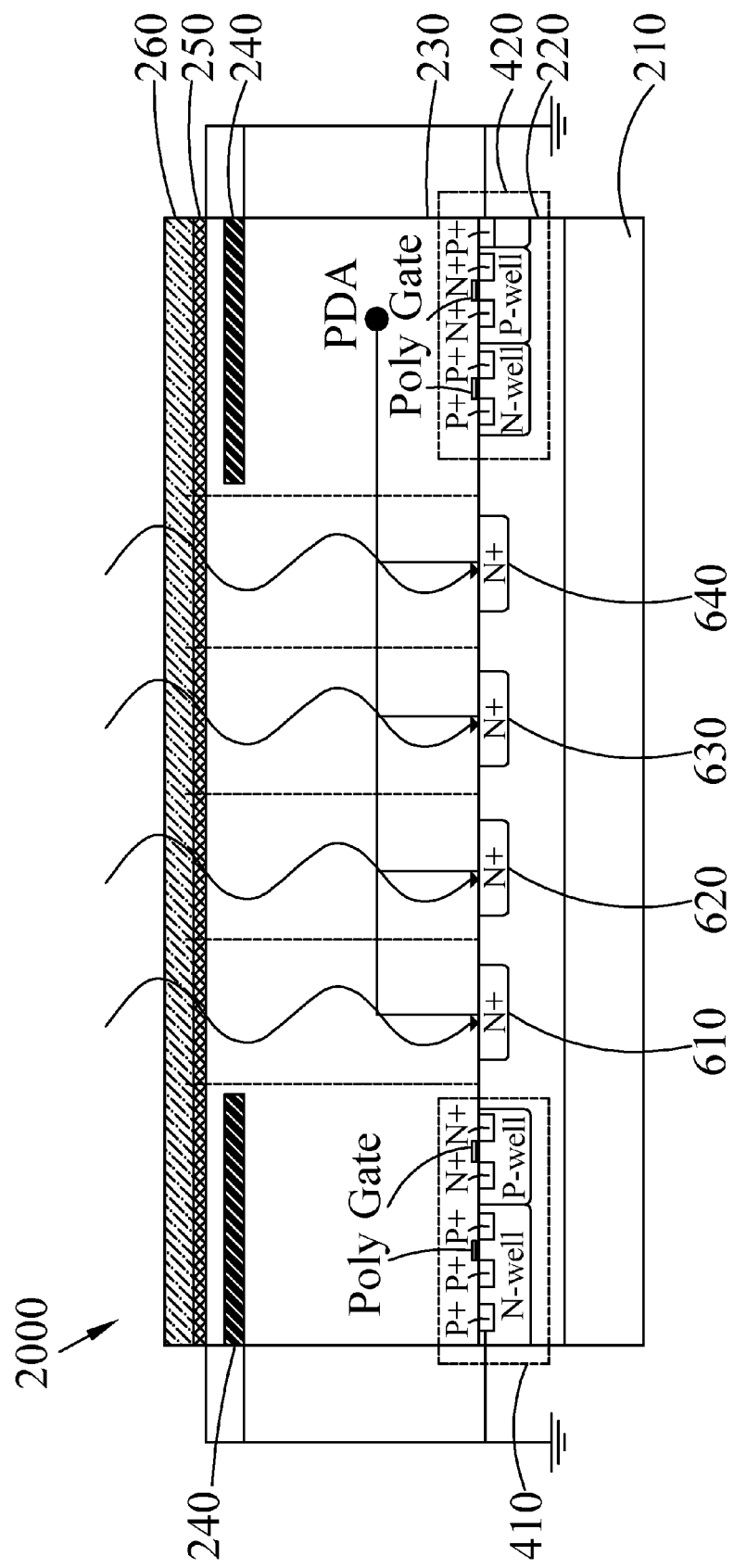
FIG. 3 is a schematic diagram of the photo-coupler device according to a second embodiment of the present invention.

With reference to FIG. 3, in which a schematic diagram of the photo-coupler device according to a second embodiment of the present invention is depicted. In the embodiment, the photo-coupler device 2000 comprises a P-type substrate 210, a P-type epitaxial layer 220, an insulating layer 230, a plurality of shielding layers 240, a metal layer 250 and a passivation layer 260. The P-type epitaxial layer 220 is deposited on the P-type substrate 210. The insulating layer 230 is deposited on the P-type epitaxial layer 220. The shielding layers 240 are deposited in the insulation layer 230 in parallel in a horizontal direction. The metal layer 250 is deposited on the insulation layers 230. The passivation layer 260 is deposited on the metal layer 250.

According to the above, the P-type epitaxial layer 220 further comprises two conducting regions 410, 420 and a plurality of N+ electrode regions between the two conducting regions 410, 420. Wherein, the plurality of shielding layers 240 correspondingly cover the two conducting regions 410, 420, and the shielding layers 240, the metal layer 250 and the two conducting regions 410, 420 are connected to a low potential contact.

According to the above, the conducting regions 410, 420 further comprise N-wells and P-wells, respectively. A high-signal transmission contact PDA may act as a photo-coupler to transmit a high voltage potential signal. The description above is only to illustrate preferred embodiments, not to limit the present invention.

Further, the plurality of N+ electrode regions further comprise a first N+ electrode region 610, a second N+ electrode region 620, a third N+ electrode region 630 and a fourth N+ electrode region 640, and the N+ electrode regions may sequentially be arranged between two of the conducting regions 410, 420, and may also be arranged in a reversed order. The description above is only to illustrate preferred embodiments, but should not be limited thereto.

Further, the P-type substrate 210 may be made of plastic, metal or glass, and the P-type substrate 210 may be a Si-substrate, preferably. The P-type epitaxial layer 220 may be made of monocrystalline silicon or polysilicon that is formed by the epitaxy process. The insulating layer 230 may be made of silicon dioxide ($SiO_2$). The shielding layers 240 may be made of aluminum, copper or other metals. The metal layer 250 may be made of silver. The passivation layer 260 may be an insulation material, and the insulation material may be silicon nitride ($Si_3N_4$), aluminium oxide ($Al_2O_3$) or zinc oxide (ZnO). The description above is only to illustrate preferred embodiments, not to limit the present invention.

It is worth noting that the thickness of the metal layer 250 may be ranged from 100 Å to 200 Å. The thickness of the shielding layers 240 may be ranged from 4000 Å to 8000 Å. The description above is only to illustrate preferred embodiments, but the used above should not be limited.

According to the above, the shielding layers 240 have a light barrier function which blocks the light and the metal layer 250 has a light penetration function which allows the light to penetrate in the photo-coupler device 2000. When the light penetrates into the passivation layer 260 and the metal layer 250, the shielding layers 240 may block the light outside to avoid the light penetrates into the conducting regions 410, 420. The light may only penetrates and prevent the light from entering into the unshielded N+ electrode regions. As a result, the photo-coupler device 2000 of the present invention may prevent the signal transmission from being influenced by the transient noise, so that the signal may be slowly transmitted and avoided an output distortion, thereby promoting the voltage conversion efficiency and the common-mode transient resistance of the photo-coupler device 2000.

Figure 4:
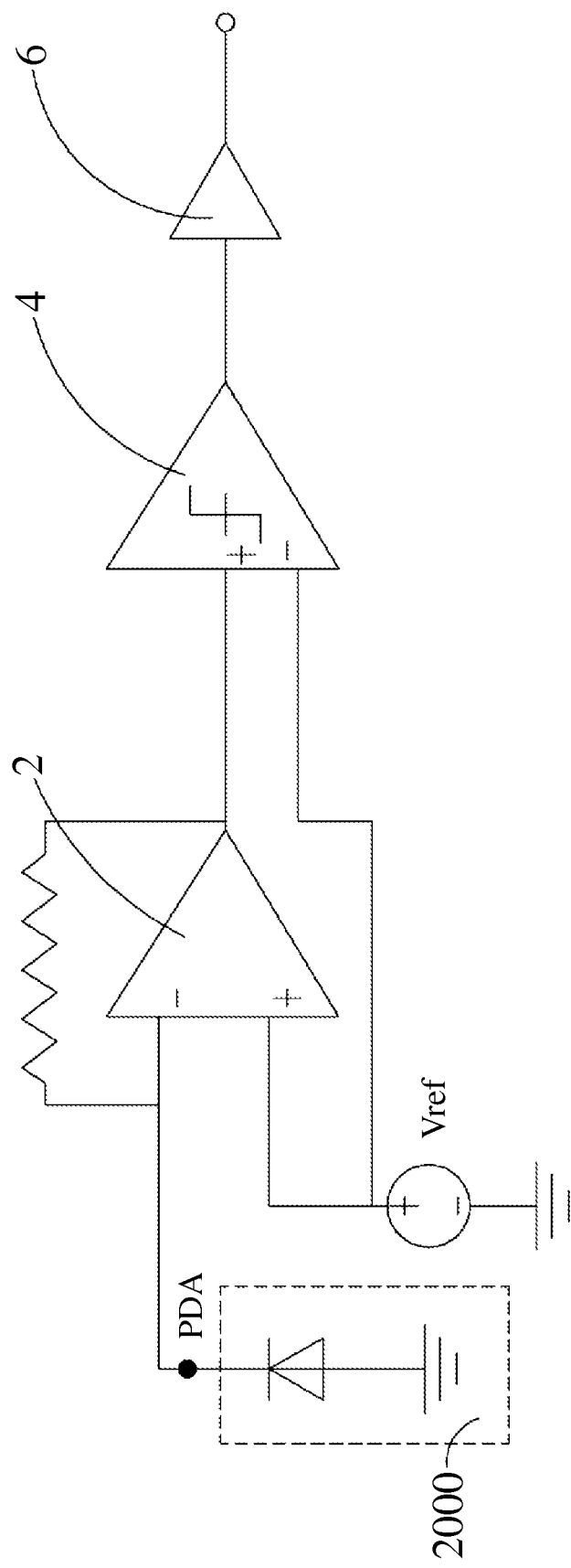
FIG. 4 is a schematic diagram of the photo-coupler device connected to a circuit according to a second embodiment of the present invention.

With reference to FIG. 4, in which a schematic diagram of the photo-coupler device is connected to a circuit according to a second embodiment of the present invention is depicted. In this figure, the circuit includes an amplifier 2, a comparator 4, and an output buffer 6. The photo-coupler device 2000 as depicted in FIG. 3 is connected to an input-end of the amplifier 2. The comparator 4 receives a transmitting signal of the amplifier 2 and a reference voltage Vref. A high-signal transmission contact PDA of the photo-coupler device 2000 is connected to a negative electrode of the amplifier 2. Wherein, the amplifier 2 may preferably be a differential amplifier, but should not be limited thereto.

Further, the photo-coupler device of the present invention is performed to a voltage slew rate (slew rate, SR) analysis test in comparison with various models of the conventional photo-coupler device, as show in Table 1. In the experimental result, the voltage slew rate (slew rate, SR) of the photo-coupler device of the present invention (cm3910a01) is 50 KV/μS which is higher than the voltage slew rate of the conventional photo-coupler devices. As a result, when the light penetrates into the photo-coupler device and produces the signal, the voltage of the signal transmission may immediately rise from a wave valley to a wave peak since the high voltage slew rate. And thus, since the high voltage slew rate, the voltage is induced to perform the transient interaction modulation so as to avoid the situation that the signal transmission not being able to accurately keep up with which causes the distortion of the analysis result of the output signal.

TABLE 1

| Produce type | Package type | LED alignment | ILED (mA) | Vo threshold (V) | Slew rate (KV/μS) |
|---|---|---|---|---|---|
| cm3910a01 | 8 pin DIP | Face to face | 0.0 | 4.0 | >50 |
| | | | 7.5 | 0.8 | 9.7 |
| cm3910a01 | 5 pin SOP | Face to face | 0.0 | 4.0 | 21.7 |
| | | | 7.5 | 0.8 | 21.7 |
| cm3912a01 | 8 pin SOP | Coplanar | 0.0 | 4.0 | 91.2 |
| | | | 7.5 | 0.8 | 89.6 |

Figure 5:
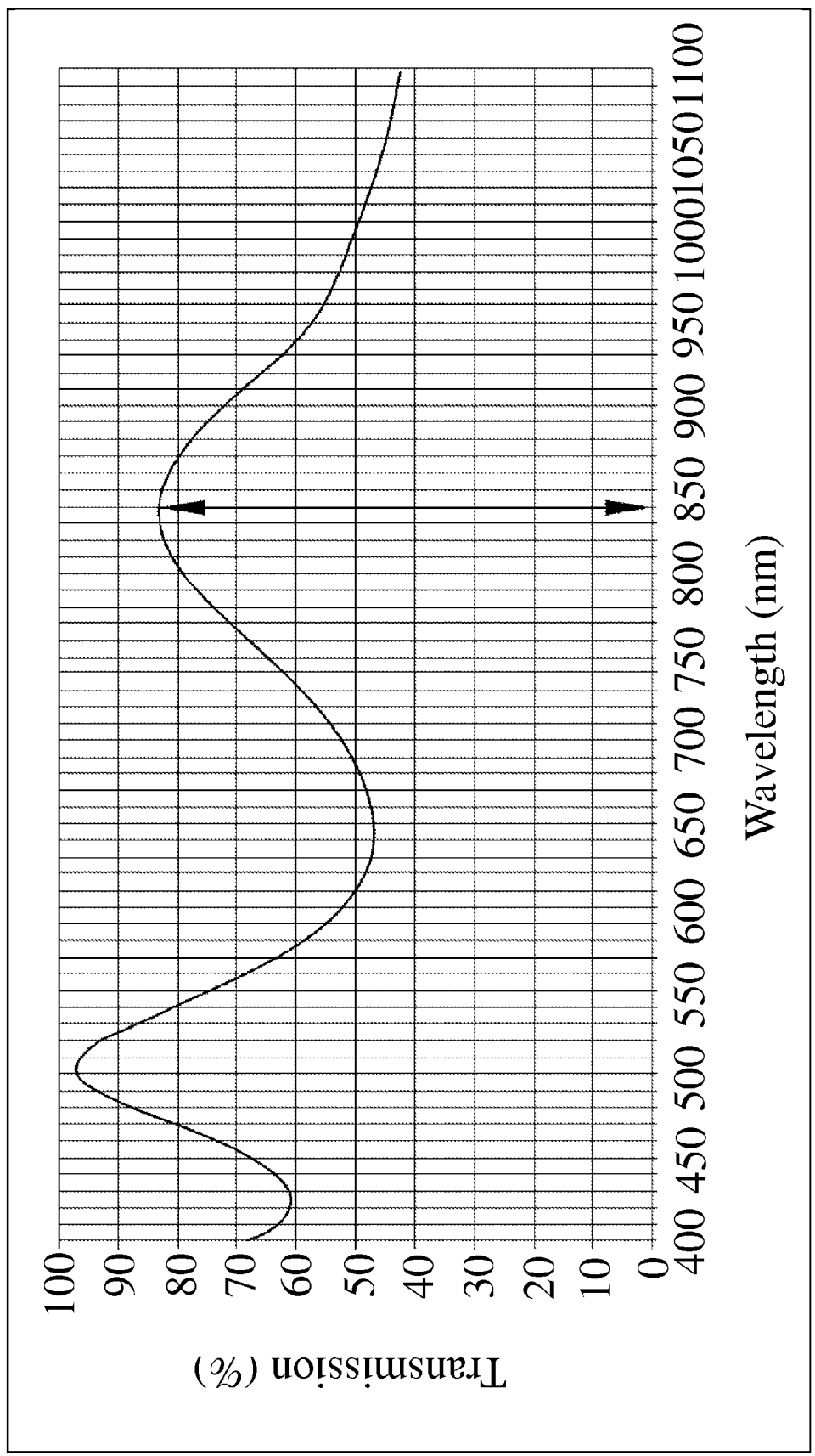
FIG. 5 is an experimental diagram of a light reaction test on the metal layer according to the present invention.

With reference to FIG. 5, in which an experimental diagram of a light reaction test on the metal layer according to the present invention. In the experimental result, the metal layer in the photo-coupler device of the present invention has good a light transmission rate which allows light of 850 nm in wavelength to transmit, at the transmission rate of 80%. Other wavelength of light, such as 650 nm, may also be designed to have such transmission rate depending on the actual needs. As a result, the photo-coupler device of the present invention has the good light transmission rate in comparison with the conventional photo-coupler device.

In summation of the description above, the photo-coupler device of the present invention may block the light by depositing the shielding layers correspondingly covering the two conducting regions and alternately covering the at least one (or unshielded ones) of the N+ electrode regions in the insulation layer. The metal layer is made of Ag and is deposited on the shield layer to replace the conventional indium tin oxide layer, so that the photo-coupler device of present invention achieves the better penetration capability and the conduction capability, and the signal may be transmitted in the differential signal transmission manner. As a result, in signal transmission, the present invention may prevent the photo-coupler device from being influenced by the transient noise. The signal may be slowly transmitted and avoided the output distortion, thereby promoting the voltage conversion efficiency and the common-mode transient resistance of the photo-coupler device.

While the means of specific embodiments in present invention has been described by reference drawings, numerous modifications and variations could be made thereto by those skilled in the art without departing from the scope and spirit of the invention set forth in the claims. The modifications and variations should in a range limited by the specification of the present invention.

What is claimed is:

1. A photo-coupler device, comprising:
    a p-type substrate;
    a p-type epitaxial layer, deposited on the p-type substrate, and comprising two conducting regions and a plurality of N+ electrode regions disposed between the two conducting regions;
    an insulation layer, deposited on the p-type epitaxial layer;
    a plurality of shielding layers comprising first shielding layers and second shielding layers, deposited in the insulation layer in parallel in a horizontal direction, and the first shielding layers being correspondingly arranged for covering the two conducting regions, the second shielding layers being correspondingly arranged for covering at least one of the N+ electrode regions;
    a metal layer, made of Ag and deposited on the insulation layer; and
    a passivation layer, deposited on the metal layer;
    wherein, the covered ones of the N+ electrode regions are connected to a low-signal transmission contact, the N+ electrode regions which are not covered by the second shielding layers are connected to a high-signal transmission contact, and the metal layer, the two conducting regions, and the first shielding layers covering the two conducting regions are connected to a low potential contact.

2. The photo-coupler device of claim 1, wherein the plurality of N+ electrode regions disposed between two of the conducting regions comprise a first N+ electrode region, a second N+ electrode region, a third N+ electrode region and a fourth N+ electrode region arranged sequentially, wherein the second shielding layers correspondingly cover the first N+ electrode region and the third N+ electrode region, or correspondingly cover the second N+ electrode region and the fourth N+ electrode region.

3. The photo-coupler device of claim 1, wherein a thickness of the metal layer is ranged from 100 Å to 200 Å.

4. The photo-coupler device of claim 1, wherein the shielding layers are made of Al or Cu.

5. The photo-coupler device of claim 4, wherein a thickness of the shielding layers is ranged from 4000 Å to 8000 Å.

6. The photo-coupler device of claim 1, wherein the passivation layer is made of insulation material.

7. The photo-coupler device of claim 6, wherein the insulation material is silicon nitride.

8. The photo-coupler device of claim 1, wherein the insulation layer is made of silicon dioxide.

9. An photo-coupler device, comprising:
    a p-type substrate;
    a p-type epitaxial layer, deposited on the p-type substrate, and comprising two conducting regions and a plurality of N+ electrode regions disposed between the two conducting regions, the N+ electrode regions being connected to a high-signal transmission contact;
    an insulation layer, deposited on the p-type epitaxial layer;
    a plurality of shielding layers, deposited in the insulation layer in parallel in a horizontal direction and correspondingly cover the two conducting regions;
    a metal layer, made of Ag and deposited on the insulation layer; and
    a passivation layer, deposited on the metal layer;
    wherein, the plurality of shielding layers, the metal layer and the two conducting regions are connected to a low potential contact.

10. The photo-coupler device of claim 9, wherein a thickness of the metal layer is ranged from 100 Å to 200 Å.

11. The photo-coupler device of claim 9 wherein the shielding layers are made of Al or Cu.

12. The photo-coupler device of claim 11, wherein a thickness of the shielding layers is ranged from 4000 Å to 8000 Å.

13. The photo-coupler device of claim 9, wherein the passivation layer is made of insulation material.

14. The photo-coupler device of claim 13, wherein the insulation material is silicon nitride.

15. The photo-coupler device of claim 9, wherein the insulation layer is made of silicon dioxide.

* * * * *